United States Patent
Wang

(10) Patent No.: US 11,947,095 B2
(45) Date of Patent: *Apr. 2, 2024

(54) DIVERGENT FRESNEL LENS AND NON-IMAGING CONCENTRATOR BASED NON-TRACKING HIGH CONCENTRATION RATIO SOLAR CONCENTRATOR

(71) Applicant: Yonghua Wang, Klamath Falls, OR (US)

(72) Inventor: Yonghua Wang, Klamath Falls, OR (US)

(73) Assignee: Yonghua Wang, Klamath Falls, OR (US)

( * ) Notice: Subject to any disclaimer, the term of this patent is extended or adjusted under 35 U.S.C. 154(b) by 54 days.

This patent is subject to a terminal disclaimer.

(21) Appl. No.: 16/873,444

(22) Filed: Apr. 13, 2020

(65) Prior Publication Data

US 2021/0318528 A1    Oct. 14, 2021

(51) Int. Cl.
*G02B 19/00* (2006.01)
*G02B 3/08* (2006.01)
(Continued)

(52) U.S. Cl.
CPC ........... *G02B 19/0028* (2013.01); *G02B 3/08* (2013.01); *G02B 5/10* (2013.01); *G02B 19/0042* (2013.01); *H02S 40/22* (2014.12)

(58) Field of Classification Search
CPC ........... G02B 19/0028; G02B 19/0023; G02B 19/0042; G02B 19/0076; G02B 3/08; G02B 5/10; G02B 5/08; G02B 5/04; G02B 5/1876; H01L 31/052; H01L 31/0525; H01L 31/0524; F24J 2/12; F24J 2/36; F24J 2/38; F24J 2/08; H02S 40/22

USPC ............... 359/727, 741–743, 565, 851–853; 126/600, 693, 694, 696, 698, 700; 136/246, 259

See application file for complete search history.

(56) References Cited

U.S. PATENT DOCUMENTS

| | | | |
|---|---|---|---|
| 8,248,712 B2* | 8/2012 | Yu | G02B 19/0009 359/743 |
| 2005/0092360 A1* | 5/2005 | Clark | F24S 23/00 136/259 |
| 2016/0048008 A1* | 2/2016 | Wang | G02B 5/10 359/837 |

OTHER PUBLICATIONS

John A. Duffie, William A. Beckman, Solar Engineering of Thermal Processes, 4th Edition, 2013, pp. 337-344, Wiley, Hoboken, New Jersey, USA.

* cited by examiner

*Primary Examiner* — Jie Lei

(57) ABSTRACT

A non-tracking non-imaging solar concentrator system, which is able to concentrate both beam light and diffuse light with high concentration ratio, comprises a Compound Parabolic Concentrator (CPC) and a domed divergent Fresnel lens. The system is configured by mounting the domed divergent Fresnel lens on the top of CPC, or making a chamber with its bottom thin transparent wall shaped into CPC and its top thin transparent wall shaped into domed divergent Fresnel lens to form a bulb-like close structure solar concentrator. Wherein, the non-image CPC with small acceptance half-angle is used to concentrate both beam light and diffuse light with high concentration ratio, and the domed divergent Fresnel lens is used to refract the incident light to enlarge the acceptance angle of CPC, and therefore to realize stationary concentration. The bulb-like close structure concentrators are stacked together to realize arbitrary high concentration ratio of solar concentrator.

4 Claims, 10 Drawing Sheets

(51) Int. Cl.
*G02B 5/10* (2006.01)
*H02S 40/22* (2014.01)

DIVERGENT FRESNEL LENS AND NON-IMAGING CONCENTRATOR BASED NON-TRACKING HIGH CONCENTRATION RATIO SOLAR CONCENTRATOR

TECHNICAL FIELD

The present disclosure relates generally to solar concentrator, more specifically, to divergent Fresnel lens and non-imaging concentrator based non-tracking high concentration ratio solar concentrator.

BACKGROUND

To enable the wide-spread adoption of solar energy and make solar energy the mainstream of power supply, the substantially low cost and highly efficient solar concentrator system is the premise.

Solar energy is clean, abundant and ubiquitously available anywhere over the world. Facing to the grand challenge of climate change and energy crisis, solar energy brings in the hope for the future of the world. However, so far, solar energy contributes less than 3% of electricity in United States. The major obstacles that impede the wide-spread adoption of solar energy technologies are the low efficiency and high cost of the current technologies. For solar energy to be a mainstream power supply supporting power grid, building, and transportation systems, solar collection and conversion systems with ultra-high efficiency and substantially low cost must be created and developed. Relative to other energy resources, solar energy suffers from the issues of low energy current density of solar radiation and the motion of the sun. The average solar radiation intensity on earth is only around 800 W/m$^2$, varying with location, weather and season. Due to the spin of the earth, the sun moves from east to west during a diurnal day.

As the widely adopted current technology, when the flat plate photovoltaic panel is installed to collect the sunlight, the large area semiconductor devices are directly taken to collect and convert solar radiation. Obviously, the large area costly semiconductor devices raise up the cost of the conventional solar technology. Apparently, reducing the area of semiconductor converter by using cheaper large area solar concentrator is a straightforward and effective approach in significantly reducing the cost of solar technology. However, although solar concentrator shrinks the area of semiconductor converter and reduces the cost of the overall solar collection and conversion system, the high concentration ratio concentrating system requires high precision tracking. The introduction of the high precision tracking system into the solar concentrating system will not only significantly increase the system cost, which most likely offsets the benefit obtained from the concentrator, but also profoundly reduces the reliability of the entire system, due to the moving parts of the tracking system. Therefore, non-tracking solar concentrator with high concentration ratio is the holy grail for high efficiency and low-cost solar system.

U.S. Pat. No. 4,230,094 to Szulmayer disclosed an imaging system consisting of a convergent Fresnel lens, a parabolic concentrator and a cylindrical receiver. Szulmayer's invention realized stationary concentration of solar energy with high concentration ratio the first time in history. However, his system only works in a limited range of incident angle of light 30°. In his system, the convergent Fresnel lens, parabolic concentrator and the cylindrical receiver must be configured for the specially shaped receiver to be located in a special position to intercept the reflected light. Another drawback of his invention is that his concentrator can't concentrate diffuse light.

U.S. Pat. No. 6,717,045 to Chen disclosed a combined imaging and non-imaging system consisting of a convergent Fresnel lens and a Compound Parabolic Concentrator (CPC). The convergent Fresnel lens concentrates the intensity of sunlight to 5 times above normal level. Then the focused sunlight is further concentrated to 20 times by the second optical concentrator CPC. Apparently, the system is unable to avoid tracking at all.

U.S. Pat. No. 3,923,381 to Winston disclosed non-imaging systems and devices for collection and concentration of electromagnetic energy and particularly solar energy. Winston's disclosure realizes the concentration of solar energy without substantial diurnal tracking. The concentrator of his invention is formed by compounding two parabolic concentrators to form a structure that enables the different reflective surface areas of the concentrator to take turn to reflect incident sunlight to concentrate it. The concentrator is referred as Compound Parabolic Concentrator (CPC). The axes of the two parabolic concentrators form an angle called acceptance half-angle $\theta_c$. The incident light, no matter it is beam light or diffuse light, will be collected and concentrated to the exit aperture, as long as it falls into the acceptance half-angle. It means that as the sun is moving, the incident angle formed between the ray of incident sunlight and the axis of CPC is varying, but as long as the incident angle is smaller than the acceptance half-angle $\theta_c$, the incident sunlight will be collected and concentrated. For a design of CPC with certain $\theta_c$, the concentrator will operate in certain period of time during a day without tracking the sun. In principle, if $\theta_c$ is sufficient, the concentrator is able to concentrate sunlight during an entire diurnal day without tracking. Unfortunately, the concentration ratio of the concentrator is determined by $\theta_c$. The larger the $\theta_c$, the smaller the (concentration ratio. For large $\theta_c$, the concentration ratio is a small number. For instance, with $\theta_c$=30, the concentration ratio is 2 (refer to John Duffie & William Beckman, Solar Engineering of Thermal Processes, 3$^{rd}$ Edition, 2006, pp 340-347). For concentration ratio only 10, $\theta_c$ must be as small as 6°. Ideally for day-long non-tracking concentration, the $\theta_c$, should be at least 75°. For practical application, the concentration ratio should be several hundreds and even more. Therefore, the grand challenge for practical non-imaging concentrator is that it should has small acceptance half-angle for high concentration ratio for CPC, but in the mean time has large acceptance half-angle for stationary concentration.

The objective of the present invention is to provide a non-image system or device that substantially enlarges the acceptance half-angle of CPC to avoid the diurnal tracking for concentration (e.g. realize stationary concentration) and in the mean time realizes large concentration ratio through a system approach. In the present invention, a domed divergent Fresnel lens is added above the input aperture of a CPC to form a refraction and reflection system. In operation, the oblique incident light, which originally forms a large incident angle relative to CPC, larger than the acceptance half-angle of CPC, is diverged by the divergent Fresnel lens first, then falls into the acceptance half-angle and get concentrated by the CPC. In the refraction and reflection system, the acceptance half-angle of CPC can be designed as small as possible to raise concentration ratio, and the divergent Fresnel lens can be designed to refract the oblique incident light to enforce it to fall into the acceptance half-angle of the CPC to realize stationary concentration.

SUMMARY

According to the present invention, a non-tracking non-imaging concentrating system with high concentration ratio is provided for the collection and concentration of solar radiation. Comprehended by the invention is a tandem structure with multiple stage concentration units stacked together to form a cascading concentrating system. In which, each of the units includes a transparent cover of divergent Fresnel lens and a CPC structure. The transparent cover of divergent Fresnel lens and the CPC structure are configured in such a way that the CPC structure with small acceptance half-angle concentrates the incident light with a large concentration ratio and the divergent Fresnel lens changes the direction of incident light to enforce the incident light falling into the acceptance half-angle of the CPC structure. In other words, the divergent Fresnel lens enlarges the acceptance half-angle of the CPC concentrator. In one of the embodiments of this present invention, both the CPC structure and the divergent Fresnel lens are shaped on the transparent wall of a bulb-like closed structure concentrator. When in operation, the incident light impinging on the stationary apparatus in any direction will be refracted by the divergent Fresnel lens first to fall in the acceptance half-angle of the CPC structure and get concentrated. Therefore, during the diurnal course of the motion of the sun, all the light in varying incident directions will be collected and concentrated. When the concentrating units are staked, and the incident light is concentrated in cascade, any high concentration ratio is able to be reached.

Further aspects and advantages of the present invention will become apparent upon consideration of the following description thereof, reference being made of the following drawing.

BRIEF DESCRIPTION OF THE DRAWINGS

The accompanying drawings, which are incorporated in and constitute a part of this specification, illustrate several embodiments of the invention and together with the description, serve to explain the principles of the invention.

DETAILED DESCRIPTION

Reference will now be made in detail to the present exemplary embodiments, examples of which are illustrated in the accompanying drawings. Wherever possible, the same reference numbers will be used throughout the drawings to refer to the same or like parts.

Figure 1:
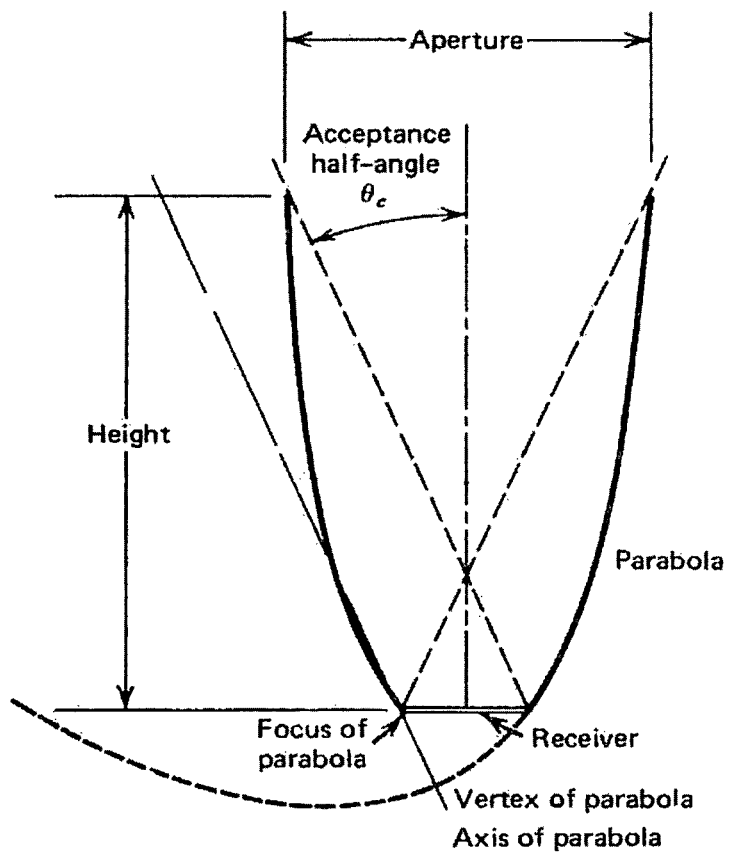
FIG. 1 is the prior art of CPC indicated in a schematic drawing on construction of the CPC concentrator, which introduces some key concepts such as acceptance half-angle $\theta_c$, focus of each of the parabolas, concentrator aperture, receiver, and axis of parabola.
Figure 7:
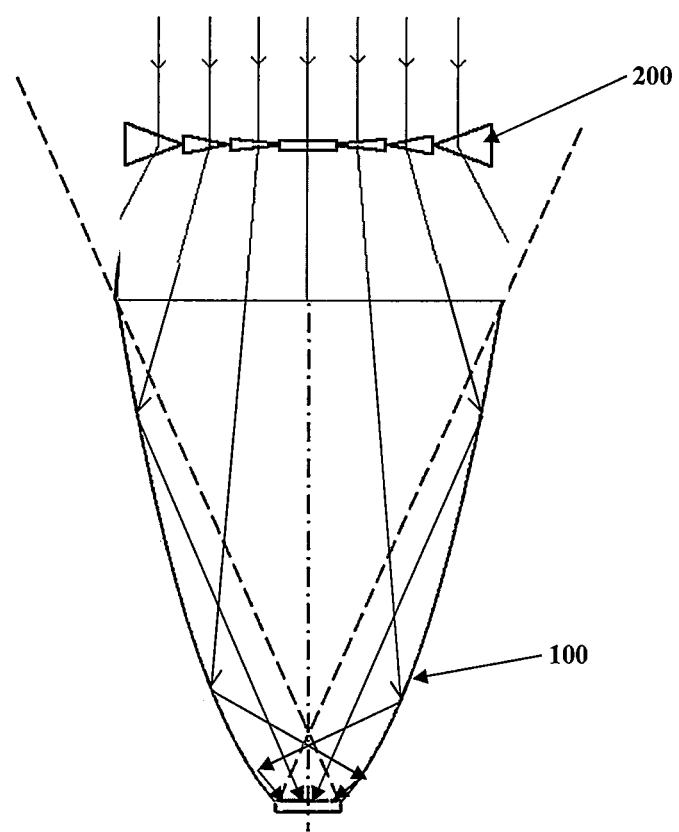
FIG. 7 is the schematic explanation on the general work principle of the divergent Fresnel lens and CPC based non-tracking non-imaging concentrating system with high concentration ratio.

Referring to FIG. 1, the prior art of the basic concepts of CPC is illustrated in the reference (FIG. 7.6.1 of John Duffie & William Beckman, Solar Engineering of Thermal Processes, 4th Edition, 2013, pp 337-344). Each side of the CPC is a parabola; the focuses and axis of parabola are indicated. Each parabola extends until its surface is parallel with the CPC axis. The angle between the axis of the CPC and the line connecting the focus of one of the parabolas with opposite edge of the aperture is the acceptance half-angle $\theta_c$. If the reflector is perfect, any radiation entering the aperture at angles between $\pm\theta_c$ will be reflected to a receiver at the base of the concentrator by spectacularly reflecting parabolic reflectors.

Figure 2:
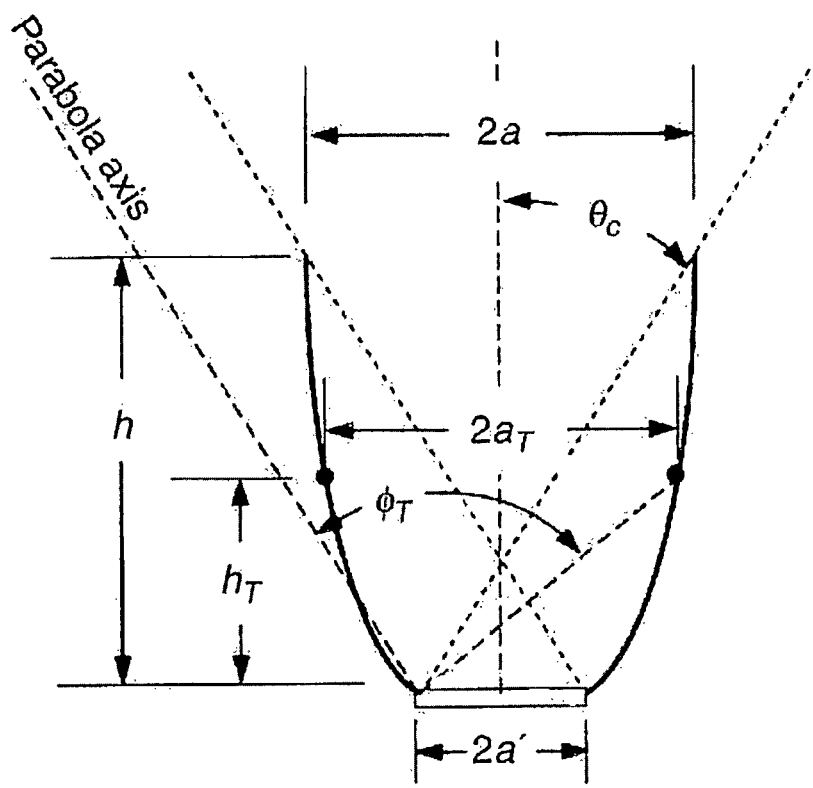
FIG. 2 is the prior art of the truncated CPC with the labels of the concentrator structure variables.

Referring to FIG. 2, the prior art of the CPC is truncated to reduce its height from h to h' with a resulting saving in reflector area but little sacrifice in performance. The truncated CPC is illustrated with the labels of structure variables.

$$f = a'(1 + \sin\theta_c)$$

$$a = \frac{a'}{\sin\theta_c}$$

$$h = \frac{f\cos\theta_c}{\sin^2\theta_c}$$

$$a_T = \frac{f\sin(\phi_T - \theta_c)}{\sin^2(\phi_T/2)} - a'$$

$$h_T = \frac{f\cos(\phi_T - \theta_c)}{\sin^2(\phi_T/2)}$$

$$C_T = \frac{a_T}{a'}$$

$$C = 1/\sin\theta_c$$

As shown in the above formula (FIG. 7.6.3 of John Duffie & William Beckman, Solar Engineering of Thermal Processes, 4th Edition, 2013, pp 337-344), where a' is the half-size of receiver, f is the focal lengthy of the elemental parabola for CPC, $\theta_c$ is acceptance half-angle, a is the half-size of aperture of the CPC, h is the height of CPC, $a_T$ is the half-size of the aperture of truncated CPC, $h_T$ is the height of truncated CPC, $\Phi_T$ is the truncation angle, $C_T$ and C are concentration ratios of truncated CPC and full CPC respectively, the concentration ratio is a function of the acceptance half-angles and truncation fraction. The smaller the acceptance half-angle is, the larger the concentration ratio is. The concentration ratio varies from 1 to 11, as the acceptance half-angle varies from 36° to 5°. For acceptance half-angle 6°, as the height-aperture ratio raises from 1 to 3, the concentration ratio changes from about 4.4 to 8.7. However, small acceptance half-angle means small aperture of concentrator and small time interval with no need for tracking. It is contradict to have high concentration ratio and realize daylong stationary concentration for CPC.

Figure 3:
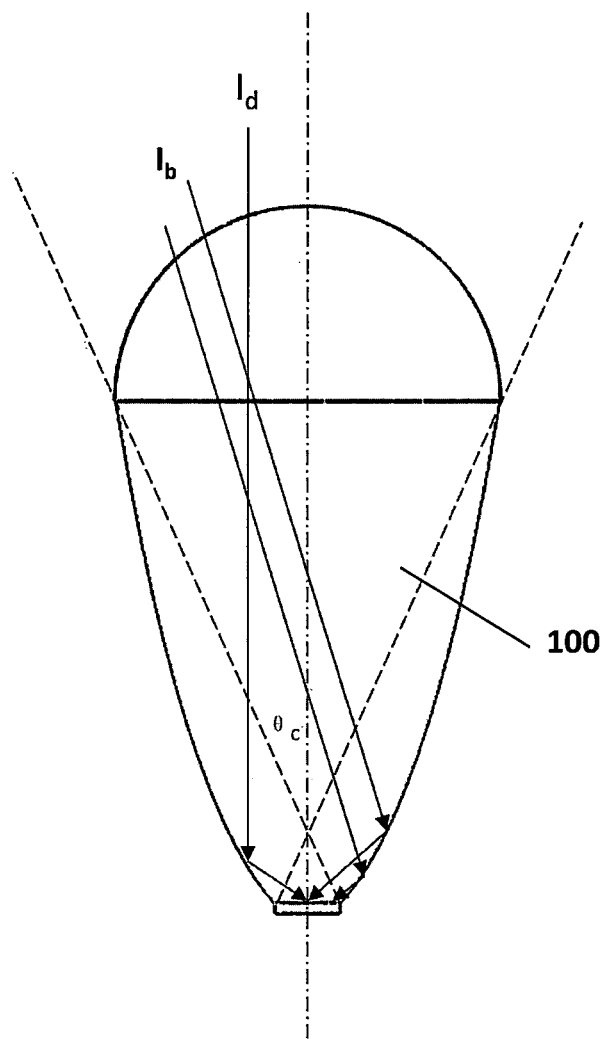
FIG. 3 is the schematic drawing illustrating the work principles of CPC concentrating both the beam light and the diffuse light.

Referring to FIG. 3, the CPC is able to concentrate both the beam light $I_b$ and the diffuse light $I_d$, as long as their incident angles relative to the CPC are smaller than the acceptance half-angle of the CPC.

Figure 4:
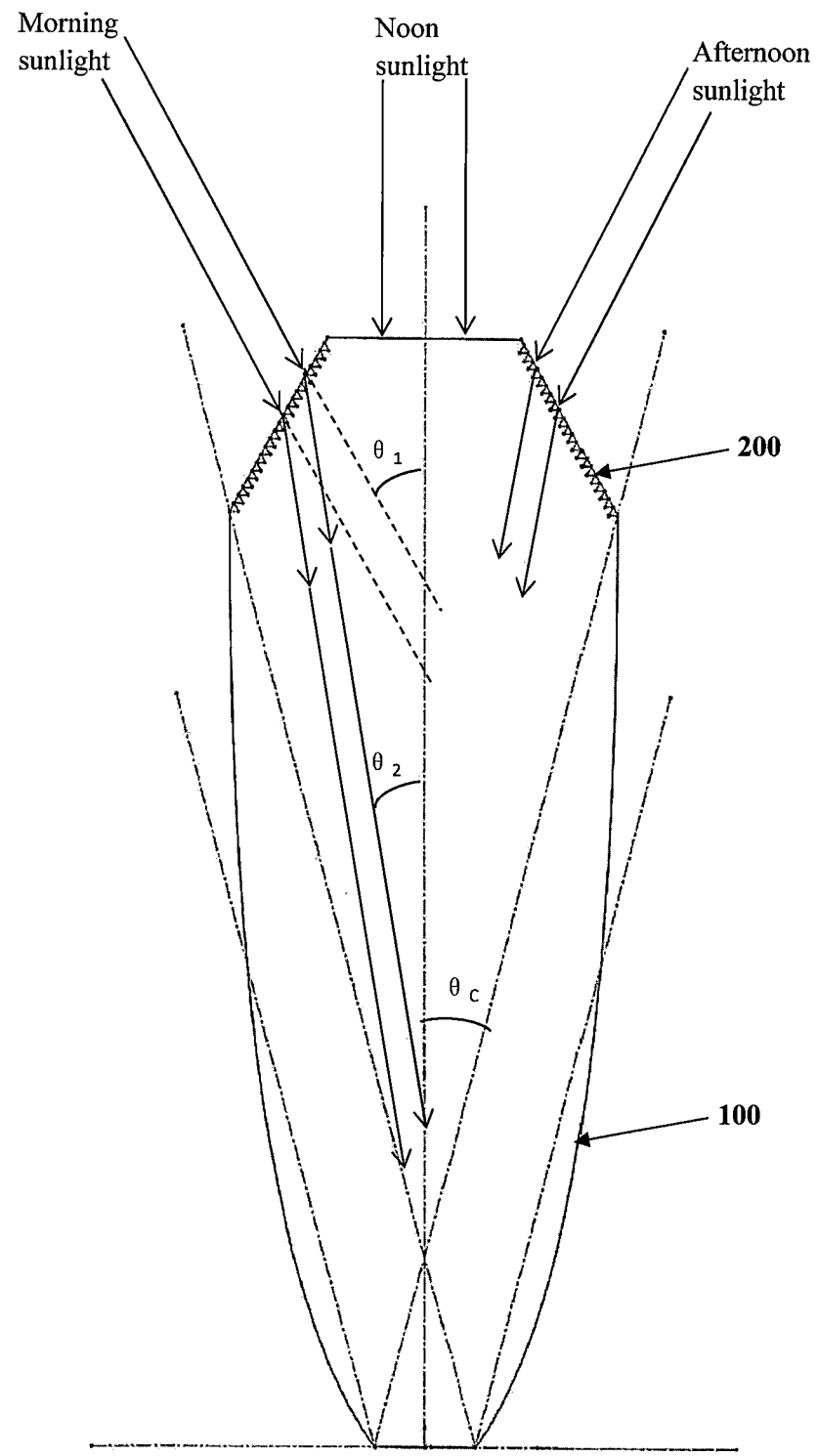
FIG. 4 is the geometric diagram showing the refraction mechanism that changes the direction of the incident light through the domed divergent Fresnel lens during a diurnal day.

Referring to FIG. 4, in the present invention, a domed divergent Fresnel lens 200 is added on the transparent cover of the conventional CPC 100 with small acceptance half-angle, so that the oblique incident light is refracted to fall in the small acceptance half-angle. During the diurnal day, the morning light with the original incident angle $\theta_1$ relative to the CPC, is refracted by the left-hand side of the domed divergent Fresnel lens, and falls into the CPC with the changed incident angle $\theta_2$, where $\theta_1 > \theta_2$, $\theta_1 > \theta_c$, $\theta_2 < \theta_c$, the afternoon light is refracted by the right-hand side of the domed divergent Fresnel lens, and the noon light is affected little.

Figure 5:
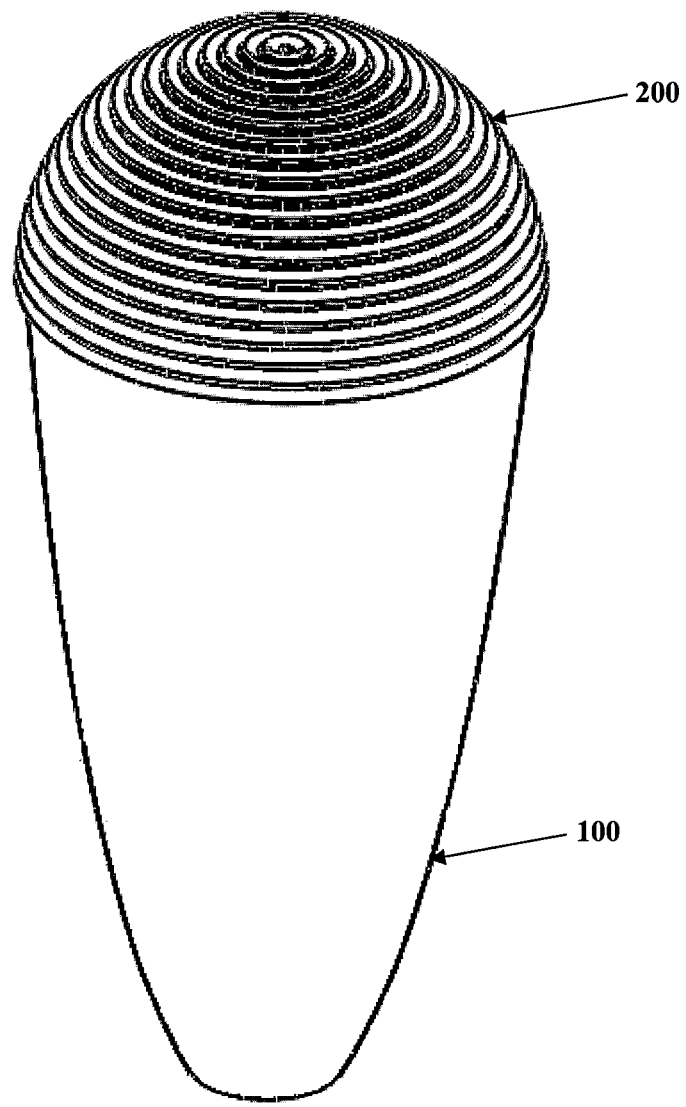
FIG. 5 is the over view of the first stage of the divergent Fresnel lens and CPC based concentrating system.

Referring to FIG. 5, the CPC concentrator 100 and the domed divergent Fresnel lens 200 are shaped on transparent wall of a bulb-like chamber and form a close structure concentrator.

Figure 6:
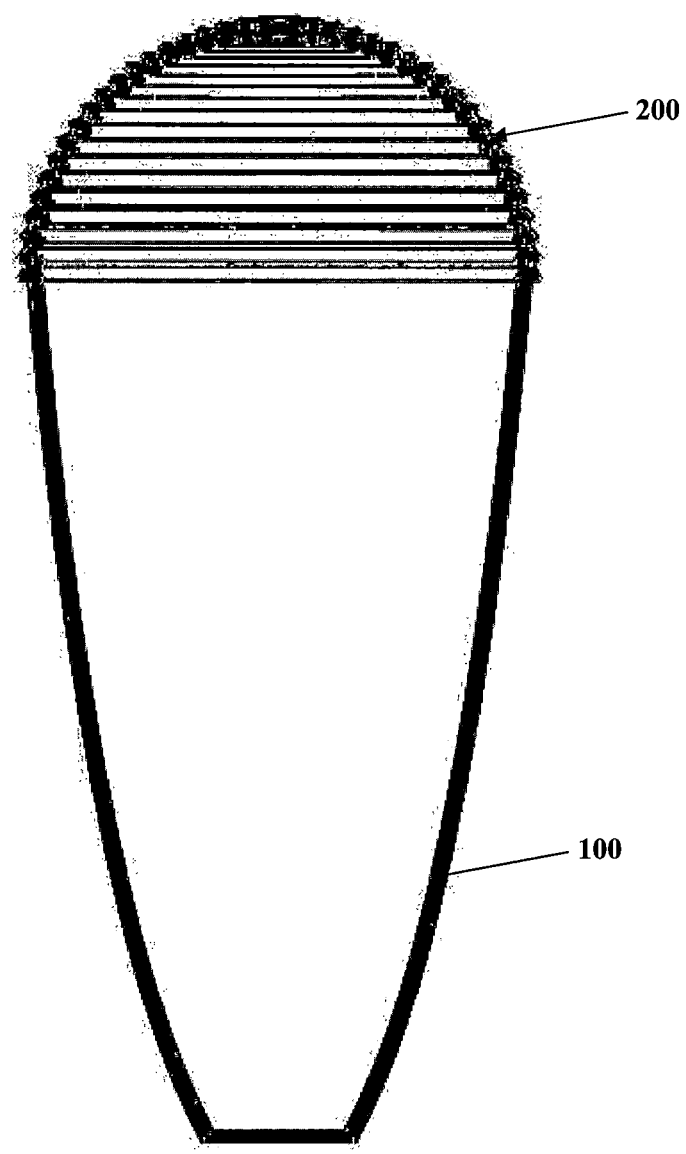
FIG. 6 is the cross-sectional view of the first stage of the divergent Fresnel lens and CPC based concentrating system.

Referring to FIG. 6, the overview of the first stage domed divergent Fresnel lens and CPC based concentrating system is demonstrated in its cross-sectional view. In this design, the domed divergent Fresnel lens 200 only has one layer. It can be designed into multi-layer structure with multiple layers of domed divergent Fresnel lens.

Referring to FIG. 7, the general work principle of the domed divergent Fresnel lens and CPC based non-tracking non-imaging concentrating system is elucidated. The incident light is firstly diverged by the divergent Fresnel lens 200, then is converged by the CPC non-imaging concentrator 100. When the input light obliquely incident, the domed divergent Fresnel lens is adopted to firstly diverge the light to reduce the incident angles relative to the CPC, then CPC is taken to concentrate the light in large concentration ratio.

Figure 8:
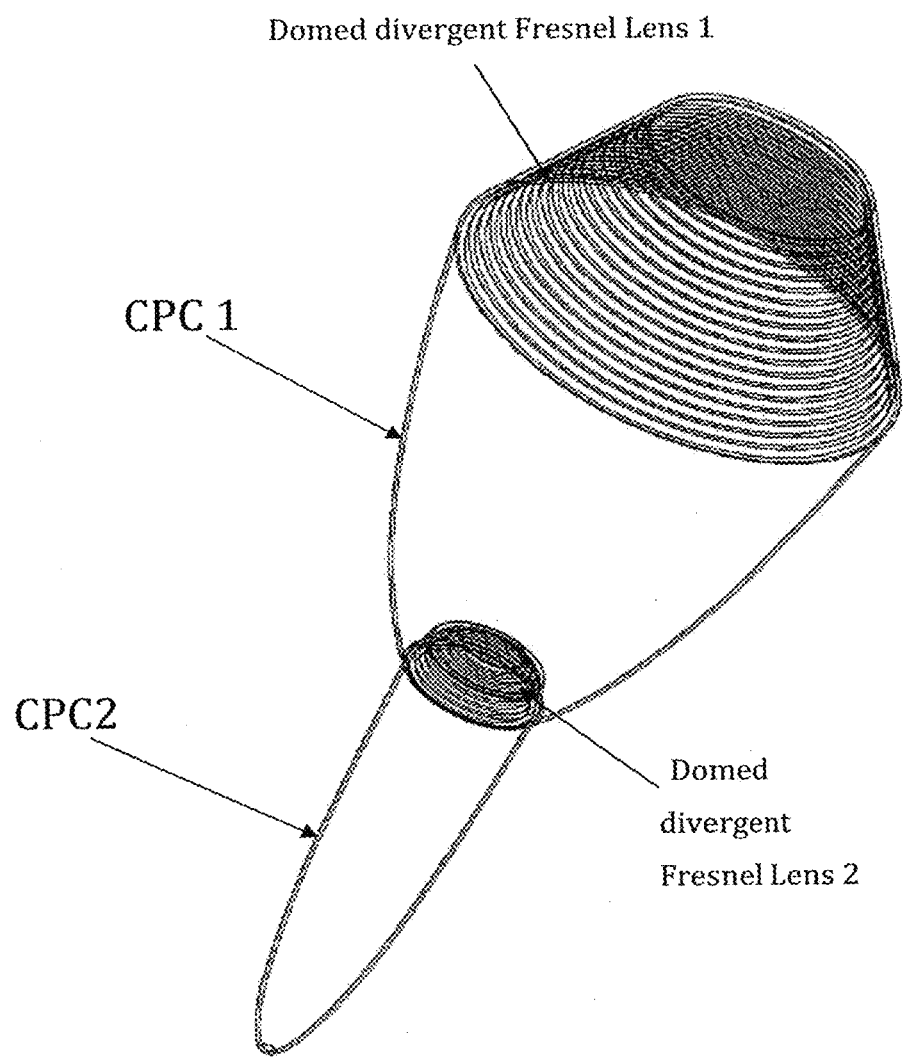
FIG. 8 is the two stages divergent Fresnel lens and CPC based non-tracking non-imaging concentrating system with high concentration ratio.

Referring to FIG. 8, an assembly of multiple concentrators is used to realize arbitrary high concentration ratio of stationary concentrator with broad acceptance angle. For instance, if the concentration ratio of the first stage concentrator is 64 and the concentration ratio of the second stage concentrator is 9, then the total concentration ratio of the stacked concentrator would be 576.

Figure 9:
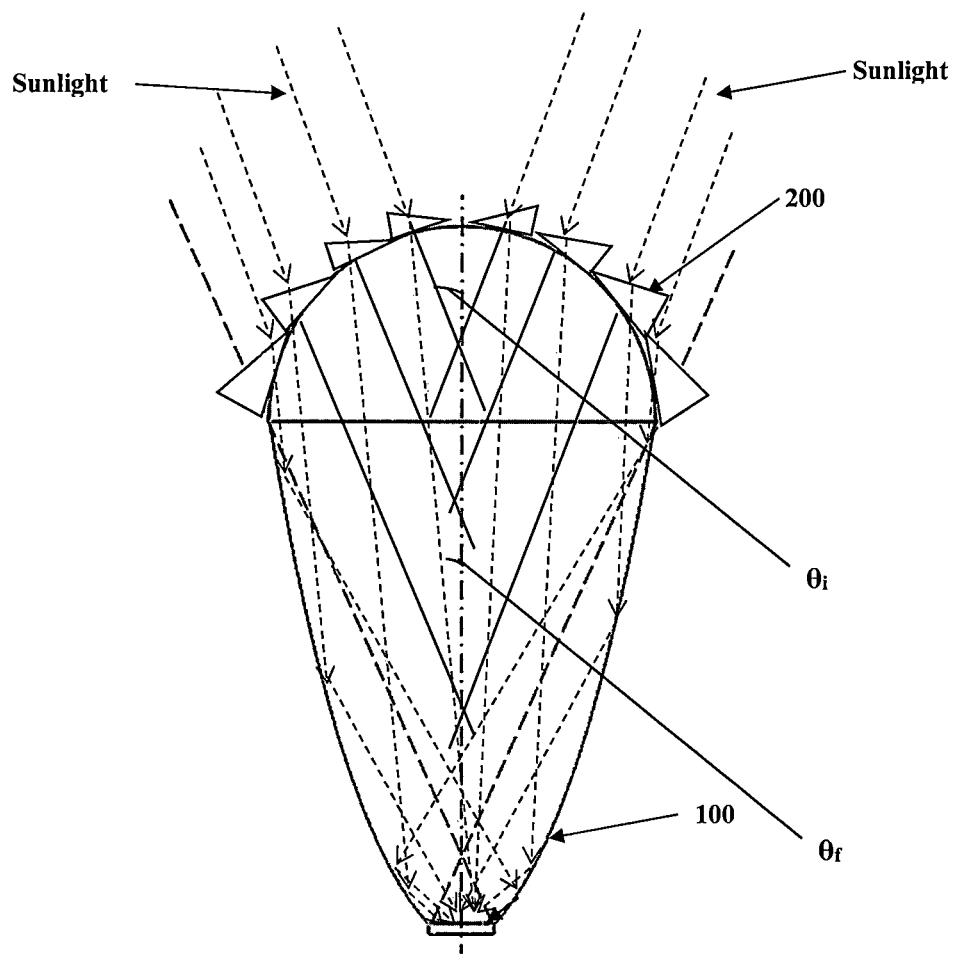
FIG. 9 is the schematic explanation on the incident angles reduction relative to the axes of the CPC through the domed divergent Fresnel lens.

Referring to FIG. 9, when the incoming sunlight impinges on the domed divergent Fresnel lens 200 of the present invention, it is firstly diverged and decreases its incident angle relative to the axes of the CPC from $\theta_i$ to $\theta_f$. If the incident angle $\theta_i = 60°$ and $\theta_f = 5°$, the concentration ratio of the CPC will be increased from 1.13 to 100 ($C = 1/\sin^2\theta_c$).

Figure 10:
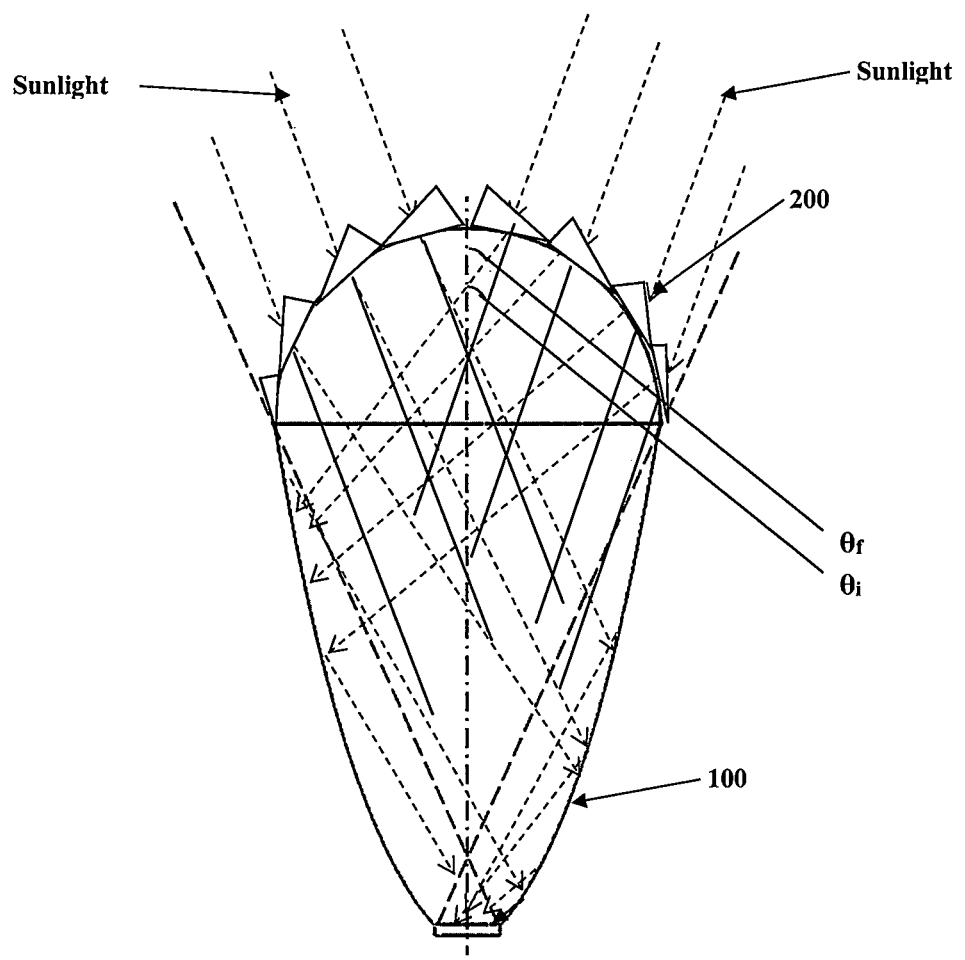
FIG. 10 is the schematic explanation on the incident angles increasing relative to the axes of the CPC through the domed convergent Fresnel lens, which is opposite to the instant application.

Referring to FIG. 10, as a comparison, if a domed convergent Fresnel lens, which is opposite to the domed divergent Fresnel lens of the instant application, is attached onto the domed transparent cover of the CPC, when sunlight obliquely incident onto the domed convergent Fresnel lenses, the overall performance of the domed convergent Fresnel lenses will be focusing the incident light into the CPC. As you can see, instead of decreasing the incident angles relative to the axes of the CPC, the incident angles relative to the axes of the CPC are increased from $\theta_i$ to $\theta_f$. Obviously, the concentration ratio will be decreased rather than increased.

The work principle of the concentrator structure is elucidated as the following. As the sun moving from east to west, the sunlight is refracted to change direction by various portion of the domed divergent Fresnel lens surrounding the CPC so that the refracted sunlight falls into the relatively small acceptance half-angle of the CPC and is concentrated by it. The addition of the domed divergent Fresnel lens to the CPC enlarges the acceptance angle of the CPC, and therefore enables the stationary concentration with high concentration ratio. Furthermore, the addition of the domed divergent Fresnel lens to the lower stage CPC concentrator make it possible to accommodate the concentrated light by the upper stage CPC through refracting the light from the upper stage of CPC and therefore to realize cascading amplification of the incident sunlight. By stacking multiple stages of concentrator, the stationary concentrator assembly can easily realize arbitrary high concentration ratio.

From the description above, a number of advantages of the solar concentrator become evident. The stationary concentrator, which is able to concentrate sunlight with high concentration ratio, completely eliminates the need of tracking system and makes it possible to dramatically reduce the cost of solar system. Low cost concentrating system is not only able to promote the wide-spread adoption of solar system, but also able to upgrade the application of solar energy. For example, the concentrating system can be widely applied to middle and high temperature systems. The application of the present invention will extraordinarily reduce the cost of solar thermal power generation. The multistage CPC concentrator can not only realize arbitrary high concentration ratio, but also reduce the reflector area of CPC significantly by adopting truncated CPC. The present concentrator works for both beam light and diffuse light.

In the preceding specification, various preferred embodiments have been described with reference to the accompanying drawings. It will, however, be evident that various other modifications and changes may be made thereto, and additional embodiments may be implemented, without departing from the broader scope of the invention as set forth in the claims that follow. The specification and drawings are accordingly to be regarded in an illustrative rather than restrictive sense.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

I claim:

1. A divergent Fresnel lens and non-imaging Compound Parabolic Concentrator (CPC) based non-tracking high concentration ratio solar concentrator system comprises a domed divergent Fresnel lens, and a non-imaging CPC concentrator with a upper opening or a non-imaging CPC concentrator with a domed transparent top cover, the domed divergent Fresnel lens is connected to the non-imaging CPC concentrator with its bottom edge, overlapping with the circumference of the upper opening of the non-imaging CPC concentrator, or the domed divergent Fresnel lens is attached onto the domed transparent cover of the non-imaging CPC concentrator;

Wherein, the domed divergent Fresnel lens diverges incident sunlight before it reach to upper aperture of the non-imaging CPC with a upper opening or the non-imaging CPC concentrator with a domed transparent top cover and reduces its incident angle relative to the axis of the CPC making it fall in acceptance half-angle of the non-imaging CPC with a upper opening or the non-imaging CPC concentrator with a domed transparent top cover any time during the diurnal day, so that sunlight incident to the upper aperture of the non-imaging CPC with a upper opening or the non-imaging CPC concentrator with a domed transparent top cover with any angle will be collected and concentrated by the CPC without tracking the sun.

2. The divergent Fresnel lens and non-imaging CPC based non-tracking high concentration ratio solar concentrator system of claim 1 can be a transparent chamber with the lower portion of its thin wall shaped into CPC coated with reflective materials on its interior surface or exterior surface and the upper portion of its thin wall shaped into a domed divergent Fresnel lens.

3. The divergent Fresnel lens and non-imaging CPC based non-tracking high concentration ratio solar concentrator system of claim 1, wherein the domed divergent Fresnel lens can be a multi-layer domed divergent Fresnel lens with more than 1 layer of domed divergent Fresnel lens.

4. Many of the divergent Fresnel lens and non-imaging CPC based non-tracking high concentration ratio solar concentrator systems of claim 1 as sub-stages can be stacked to form multistage concentrator.

* * * * *